(12) United States Patent
Chen et al.

(10) Patent No.: US 8,809,976 B2
(45) Date of Patent: Aug. 19, 2014

(54) METHOD AND STRUCTURE FOR A MRAM DEVICE WITH A BILAYER PASSIVATION

(75) Inventors: Chih-Ming Chen, HsinChu (TW);
Chung-Yi Yu, Hsin-Chu (TW);
Cheng-Yuan Tsai, Chu-Pei (TW);
Kai-Wen Cheng, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 13/244,346

(22) Filed: Sep. 24, 2011

(65) Prior Publication Data

US 2013/0075838 A1 Mar. 28, 2013

(51) Int. Cl.
*H01L 29/82* (2006.01)
*H01L 43/08* (2006.01)
*H01L 27/22* (2006.01)
*G11C 11/16* (2006.01)
*B82Y 25/00* (2011.01)
*B82Y 10/00* (2011.01)

(52) U.S. Cl.
CPC ............... *H01L 43/08* (2013.01); *H01L 27/228* (2013.01); *G11C 11/16* (2013.01); *B82Y 25/00* (2013.01); *B82Y 10/00* (2013.01)
USPC .......................................................... 257/421

(58) Field of Classification Search
CPC ...... H01L 43/08; H01L 27/228; G11C 11/16; B82Y 25/00; B82Y 10/00

USPC .......................................................... 257/421
See application file for complete search history.

(56) References Cited

U.S. PATENT DOCUMENTS

| 2004/0137681 A1* | 7/2004 | Motoyoshi | 438/257 |
| 2006/0276034 A1* | 12/2006 | Blanchard | 438/672 |
| 2009/0209050 A1* | 8/2009 | Wang et al. | 438/3 |

OTHER PUBLICATIONS

Unpublished U.S. patent application filed Sep. 22, 2011, titled "Technique for Smoothing an Interface Between Layers of a Semiconductor Device," U.S. Appl. No. 13/240,714, 32 pages.
Unpublished U.S. patent application filed Sep. 24, 2011, titled "Structure and Method for a MRAM Device with an Oxygen Absorbing Cap Layer," U.S. Appl. No. 13/244,349, 27 pages.

* cited by examiner

*Primary Examiner* — Anthony Ho
(74) *Attorney, Agent, or Firm* — Haynes and Boone, LLP

(57) ABSTRACT

The present disclosure provides a magnetoresistive random access memory (MRAM) device. The MRAM device includes a magnetic tunnel junction (MTJ) stack on a substrate; and a dual-layer passivation layer disposed around the MTJ stack. The dual-layer passivation layer includes an oxygen-free film formed adjacent sidewalls of the MTJ stack; and a moisture-blocking film formed around the oxygen-free film.

17 Claims, 3 Drawing Sheets

METHOD AND STRUCTURE FOR A MRAM DEVICE WITH A BILAYER PASSIVATION

BACKGROUND

In integrated circuit (IC) devices, magnetic random access memory (MRAM) is an emerging technology for next generation embedded memory devices. MRAM is a memory device including an array of MRAM cells each of which stores a bit of data using resistance values, rather than electronic charge. Each MRAM cell includes a magnetic tunnel junction ("MTJ") cell, the resistance of which can be adjusted to represent logic "0" or logic "1." Conventionally, the MTJ cell includes an anti-ferromagnetic ("AFM") pinning layer, a ferromagnetic fixed, or pinned, layer, a thin tunneling barrier layer, and a ferromagnetic free layer. The resistance of the MTJ cell may be adjusted by changing the direction of the magnetic moment of the ferromagnetic free layer with respect to that of the fixed magnetic layer. In particular, when the magnetic moment of the ferromagnetic free layer is parallel to that of the ferromagnetic fixed layer, the resistance of the MTJ cell is low, corresponding to a logic 0, whereas when the magnetic moment of the ferromagnetic free layer is anti-parallel to that of the ferromagnetic fixed layer, the resistance of the MTJ cell is high, corresponding to a logic 1. The MTJ cell is coupled between top and bottom electrodes and an electric current flowing through the MTJ cell from one electrode to the other may be detected to determine the resistance, and therefore the logic state, thereof. However, various damages to the MTJ cell, including oxygen and moisture damage to the free ferromagnetic layer and the tunneling barrier layer, result in poor thermal stability of the MTJ cell. Accordingly, it would be desirable to provide an improved MRAM structure and method of manufacturing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
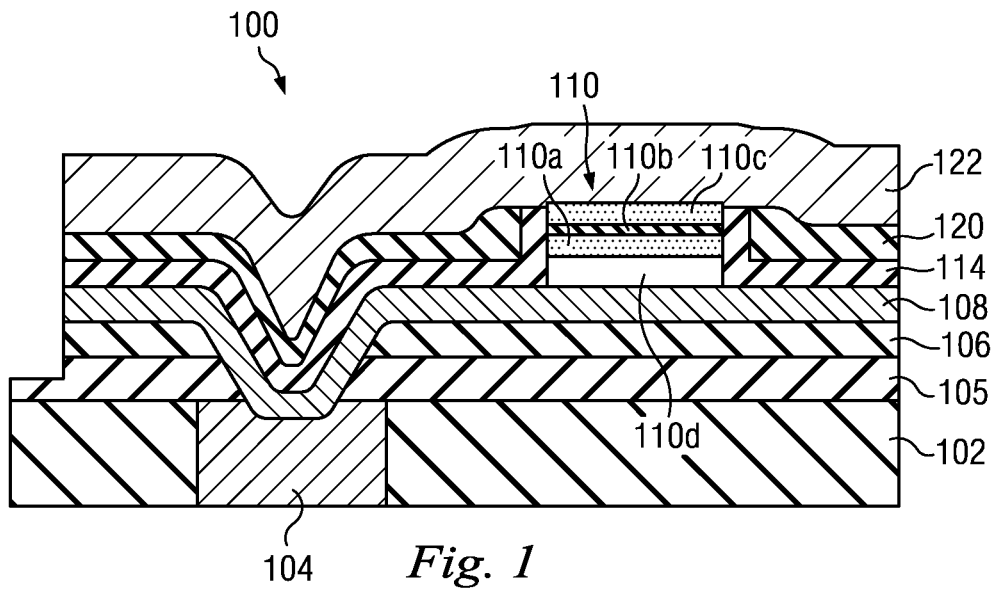
FIG. 1 illustrates a memory device fabricated in accordance with one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates an MRAM device 100 in accordance with an embodiment described herein. As shown in FIG. 1, in one embodiment, the device 100 is formed on a substrate, such as silicon substrate or alternatively other suitable semiconductor substrate. The MRAM device 100 includes an interlayer dielectric ("ILD") 102 disposed on the substrate and having a conductive feature 104 formed therein. In one example, the conductive feature 104 includes seed via.

In one embodiment, a first dielectric layer 105 is formed on the ILD 102. The first dielectric layer 105 may be used as an etch stop layer during a subsequent etch process. In one embodiment, the first dielectric layer includes silicon carbide (SiC). In another embodiment, a second dielectric layer 106 is formed on the first dielectric layer 105. The second dielectric layer 106 may be utilized for material integration consideration. In one example, the second dielectric layer 106 includes silicon nitride (SiN). In the present embodiment, the dielectric layers 105 and 106 are patterned to form an opening such that the conductive feature 104 is exposed in the opening.

A first electrode (or bottom electrode) 108 is formed over the dielectric layers, such as the second dielectric layer 106. Particularly, the bottom electrode 108 is disposed on the conductive feature 104 and directly contacting the conductive feature 104. The bottom electrode 108 includes a conductive material. In one embodiment, the bottom electrode includes tantalum (Ta). In another embodiment, the bottom electrode includes tantalum nitride (TaN). In other embodiments, the bottom electrode 108 may include other appropriate materials, such as titanium (Ti), platinum (Pt) or ruthenium (Ru). In another embodiment, the bottom electrode 108 has a thickness ranging between about 100 angstrom and about 300 angstrom.

An MTJ stack 110 is formed on and electrically connected to the bottom electrode 108. The MTJ stack 110 includes a pinned layer 110a, a barrier layer 110b on the pinned layer, and a free layer 110c disposed on the barrier layer. The MTJ stack 110 further includes a pinning layer 110d such that the pinned layer is between the pinning layer and the barrier layer.

In one embodiment, the pinning layer 110d includes an anti-ferromagnetic (AFM) material. In the anti-ferromagnetic material, the magnetic moments of atoms or molecules align in a regular pattern with neighboring spins pointing in opposite directions. In one example, the pinning layer 110d includes platinum manganese (PtMn). In another example, the pinning layer 110a includes iridium manganese ("IrMn"), rhodium manganese ("RhMn"), or iron manganese ("FeMn"). In another example, the anti-ferromagnetic pinning layer has a thickness ranging between about 100 angstrom and about 200 angstrom. The pinning layer 110d is formed by a suitable deposition technique, such as PVD.

In one embodiment, the pinned layer 110a includes a ferromagnetic material layer. The ferromagnetic material can form permanent magnets and/or exhibit strong interactions with magnets. In one embodiment, the pinned layer 110a includes a cobalt-iron-boron (CoFeB) film. The pinned layer 110a may alternatively include other ferromagnetic material, such as CoFeTa, NiFe, CoFe, CoPt, CoPd, FePt, or the alloy of Ni, Co and Fe. As one example, the CoFeB film is formed by PVD, or alternatively other suitable process.

In another embodiment, the pinned layer 110a may includes a synthetic anti-ferromagnetic (SAF) material having a plurality of films. In one example, the pinned layer 110a includes two ferromagnetic films interposed by a spacer layer. In another example, the pinned layer 110a includes a plurality of ferromagnetic films with neighbor ferromagnetic films separated by a respective spacer layer. In one embodiment, the spacer layer includes Ru. Alternatively, the spacer layer may include other suitable material, such as Ti, Ta, Cu, or Ag. In one example, the spacer layer may have a thickness ranging between about 5 angstrom and about 10 angstrom. The spacer layer may be formed by a PVD, or another suitable process.

The barrier layer 110b includes a non-magnetic material. In one embodiment, the barrier layer 110b includes magnesium (Mg). Alternatively, the barrier layer 110b may include MgO, AlO, aluminum nitride (AlN), aluminum oxynitride (AlON), or other suitable non-magnetic material. In another embodiment, the barrier layer 110b includes a first film of MgO and a second film of Mg over the first film, which may be formed by Mg deposition, Mg oxidation and Mg deposition. The barrier layer 110b is thin enough such that electrons can tunnel through the barrier layer when a biasing voltage is applied on. In one embodiment, the barrier layer 110b has a thickness ranging between about 5 angstrom and about 15 angstrom. The barrier layer 110b may be formed by PVD. In one example, a magnesium target is used with an oxygen gas provided in a sputtering chamber to form magnesium oxide. Alternatively, a magnesium film is formed first by sputtering and then converting it into the MgO film by applying an oxygen gas. In another embodiment of the barrier layer, a first magnesium film is formed by sputtering and then converting it into the MgO film by applying an oxygen plasma, and then a second Mg layer is deposited on the MgO layer by sputtering.

The free layer 110c may also include a ferromagnetic material but it is not pinned because there is no anti-ferromagnetic material adjacent the free layer. Therefore, the magnetic orientation of the layer is free, thus referred to as a free layer. The free layer 110c may include a ferromagnetic material similar to the ferromagnetic material used in the pinned layer 110a. In one embodiment, the free layer 110c includes a CoFeB film. In one example, the CoFeB may have compositions expressed as $(Co_xFe_{1-x})_{80}B_{20}$, wherein the x is an alloy mole fraction and ranges between 0 and 100. the subscripts "80" and "20" are also mole fractions. The free layer 110c may have a thickness ranging between about 10 angstrom and about 20 angstrom. The free layer 110c may be deposited by a process, such as PVD. In another embodiment, the free layer may include two or more ferromagnetic films of different materials interposed by a spacer layer between neighbor ferromagnetic films.

In accordance with features of one embodiment, the MRAM device 100 further includes a dual-layer passivation layer 114 is formed over the bottom electrode 108 provided and along sidewalls of the MTJ stack 110. The dual-layer passivation layer 114 includes an oxygen-free layer on the sidewalls of the MTJ stack 110 and a moisture-blocking (or moisture-barrier) layer on the oxygen-free layer. In one embodiment, the oxygen-free layer includes an oxygen-free dielectric material. In another embodiment, the moisture-blocking layer includes an oxygen-containing material. In furtherance of the embodiment, the moisture-blocking layer includes a metal oxide.

In another embodiment, the dual-layer passivation layer 114 is formed as follows. The purpose of the dual-layer (or bi-layer) passivation layer 114 is to better protect the ferromagnetic free layer and tunneling barrier layer from the environmental moisture and oxygen. To create the passivation layer 114, an oxygen-free film is first deposited. In one example, the oxygen-free film includes silicon nitride (SiN) deposited by chemical vapor deposition (CVD), therefore referred to as CVD SiN. In another example, the oxygen-free film includes silicon carbide (SiC) deposited by CVD, therefore referred to as CVD SiC. In another example, the oxygen-free film includes SiN or SiC deposited by radical CVD, therefore referred to as radical CVD SiN or radical CVD SiC, respectively. In yet another example, the oxygen-free film includes SiN or SiC deposited by PVD, therefore referred to as PVD SiN or PVD SiC, respectively. An oxygen-free film is used because the free layer will be oxidized if an oxygen-based film is used as the passivation layer. Additionally because there is a risk of damage to the tunneling barrier layer and ferromagnetic free layer if a plasma process is used, a plasma-free deposition may be used PVD. As used herein, "oxygen-free" includes materials having an oxygen concentration of less than one atomic percent by X-ray photoelectron spectroscopy (XPS) or auger analysis, for materials deposited using a method other than PVD (e.g., CVD SiN and CVD SiC), and materials having an oxygen concentration of less than approximately ten atomic percent for materials deposited by PVD (e.g., PVD SiN and PVD SiC).

Next, the moisture-blocking layer is deposited. The moisture-blocking layer includes a metal oxide material capable of blocking moisture, such as aluminum oxide (AlO), tantalum oxide (TaO), or titanium oxide (TiO) deposited by PVD or atomic layer deposition (ALD). Those materials are referred to as PVD AlO, PVD TaO, PVD TiO, ALD AlO, ALD TaO, and ALD TiO, respectively. In the illustrated embodiment, the dual-layer passivation layer 114 includes CVD SiN having a first thickness and PVD AlO having a second thickness. The first thickness is greater than the second thickness. In one example, the oxygen-free film includes CVD SiN and the moisture-blocking layer includes PVD AlO.

After deposition of the layer 114, another dielectric layer 120, such a silicon oxide layer, is deposited as a shielding layer over the passivation layer 114. In the present embodiment, The silicon oxide layer 120 is formed by plasma enhanced CVD, therefore referred to as plasma-enhanced oxide (PEOX) layer.

A second electrode (or top electrode) 122 is formed over and electrically connected to the MTJ stack 110. The top electrode 122 includes a conductive material. The top electrode 122 may be similar to the bottom electrode 108 in terms of composition and deposition. In the illustrated embodiment, the top electrode 122 includes Ta. In another embodiment, the top electrode 122 includes TaN. In yet other embodiments, the top electrode 122 may include other appropriate materials, such as titanium (Ti), platinum (Pt) or ruthenium (Ru). In one example, the top electrode 122 has a thickness ranging between about 200 angstrom and about 600 angstrom.

Figure 2:
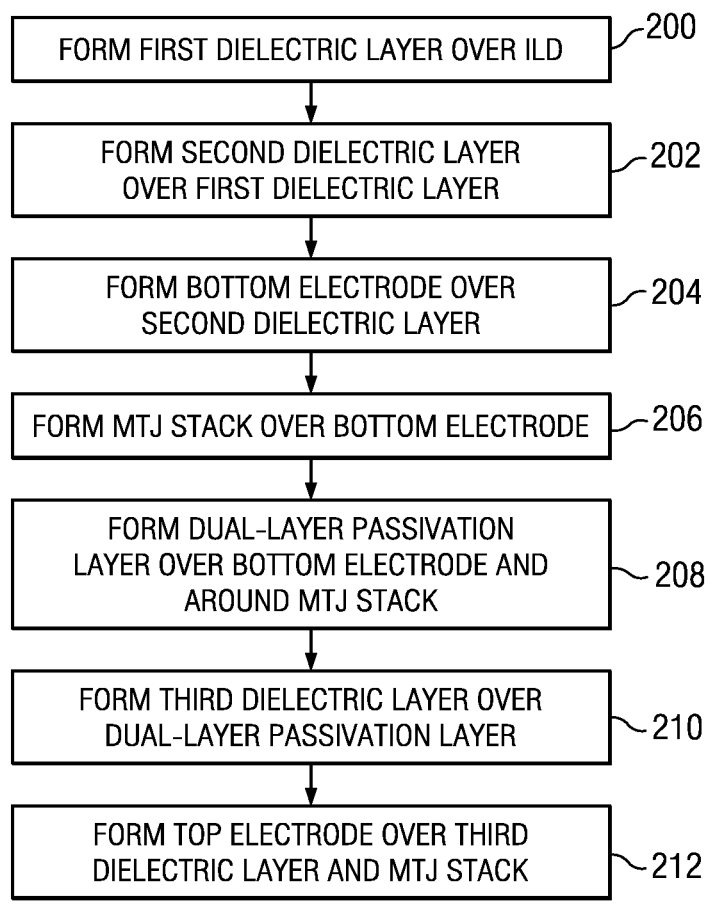
FIG. 2 is a flowchart of a method of fabricating a memory device such as that illustrated in FIG. 1 in accordance with one embodiment.
Figure 3A:
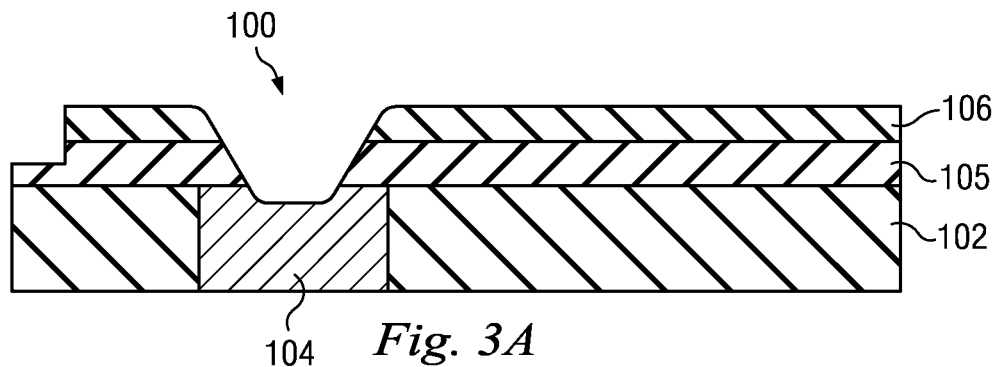
FIGS. 3A-3F illustrate various steps involved in fabricating the memory device of FIG. 1 in accordance with the method of FIG. 2.

FIG. 2 is a flowchart illustrating a method of fabricating an MRAM device 100 such as that illustrated in FIG. 1. In step 200, a first dielectric layer 105 is formed over an ILD 102 and a conductive feature embedded in the ILD 102, as illustrated in FIG. 3A. In step 202, a second dielectric layer 106 is formed over the first dielectric layer 105, as illustrated in FIG. 3A. In one embodiment, the depositions of the first and second dielectric layers 105 and 106 are achieved by CVD techniques.

The first and second dielectric layers 105 and 106 are further patterned to form an opening such that the conductive feature 104 is exposed in the opening for further electrical routing. The patterning of the first and second dielectric layers 105 and 106 is implemented by lithography process and etching. For example, a patterned photoresist layer is formed on the second dielectric layer 106 by a lithography process. An etching process is applied to the second and first dielectric layers 105 and 106 using the patterned photoresist layer as an etching mask. The photoresist layer is stripped after the etching process.

Figure 3B:
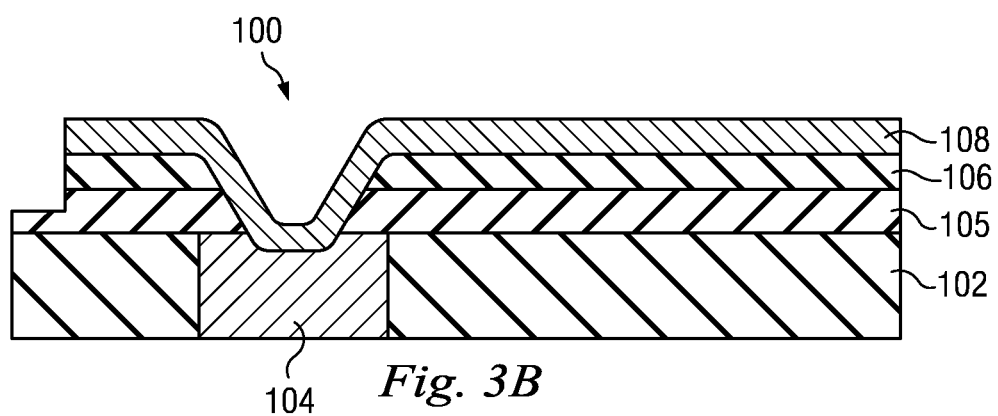

In step 204, a bottom electrode 108 is formed over the second dielectric layer 106, as illustrated in FIG. 3B. The bottom electrode 108 is also formed on and electrically contact with the conductive feature 104. In one embodiment, the bottom electrode 108 is deposited by PVD.

Figure 3C:
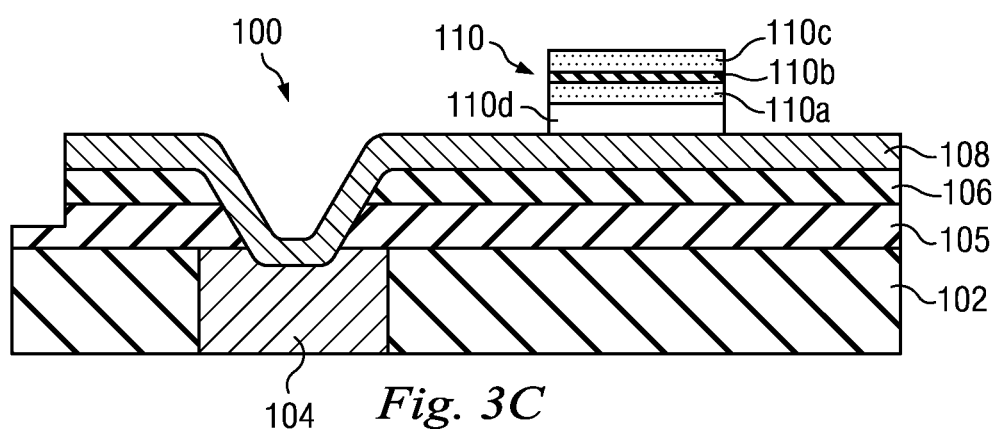

In step 206, an MTJ stack 110 is formed on the bottom electrode 108, as illustrated in FIG. 3C. The MTJ stack 110 is formed by depositions and patterning. In one embodiment, various material layers of the MTJ stack 110, such as pinning layer, pinned layer, barrier layer and free layer, are deposited, respectively. Then the material layers are patterned to form one or more MTJ stacks by lithography and etching.

Figure 3D:
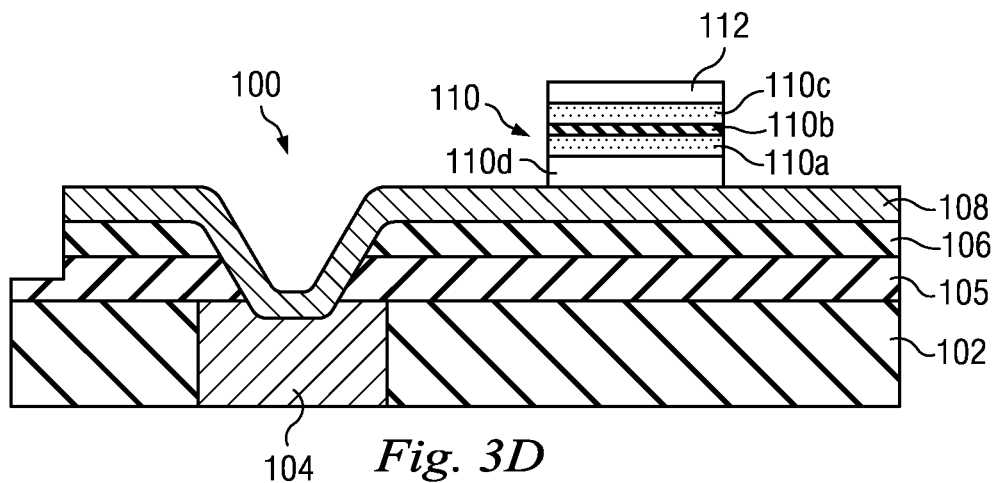

In patterning the various material layers, a hard mask layer may be formed and used as an etch mask. As one embodiment, various material layers of the MTJ stack 110 (e.g., pinning layer, pinned layer, barrier layer and free layer) are deposited. Additionally, a hard mask layer 112 is deposited on the free layer. Then the hard mask layer 112 is patterned by lithography and etching. Then the material layers are patterned to form one or more MTJ stacks by etching using the patterned metal layer as an etch mask, as illustrated in FIG. 3D. The hard mask layer may be removed after the patterning of the MTJ stack. In another embodiment, the hard mask layer 112 may include tantalum and remain on the MTJ stack after the patterning.

Figure 3E:
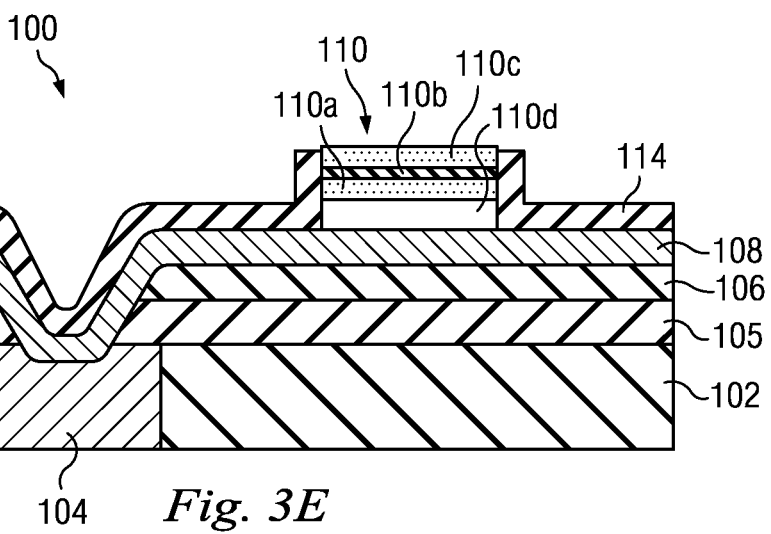

In step 208, a dual-layer passivation layer 114 is formed over the bottom electrode and around the MTJ stack in the manner described in detail above with reference to FIG. 1, as illustrated in FIG. 3E. Particularly, the dual-layer passivation layer 114 includes an oxygen-free layer adjacent the sidewalls of the MTJ stack 110 and a moisture blocking layer. The oxygen-free layer includes SiN or SiC and may be formed by CVD or PVD. In the present embodiment, the moisture-blocking layer is formed by a plasma-free deposition technique, such as radical CVD or remote plasma deposition. In another embodiment, an anisotropic etching process, such as a dry etch, may be applied to partially etch the dual-layer passivation layer.

Figure 3F:
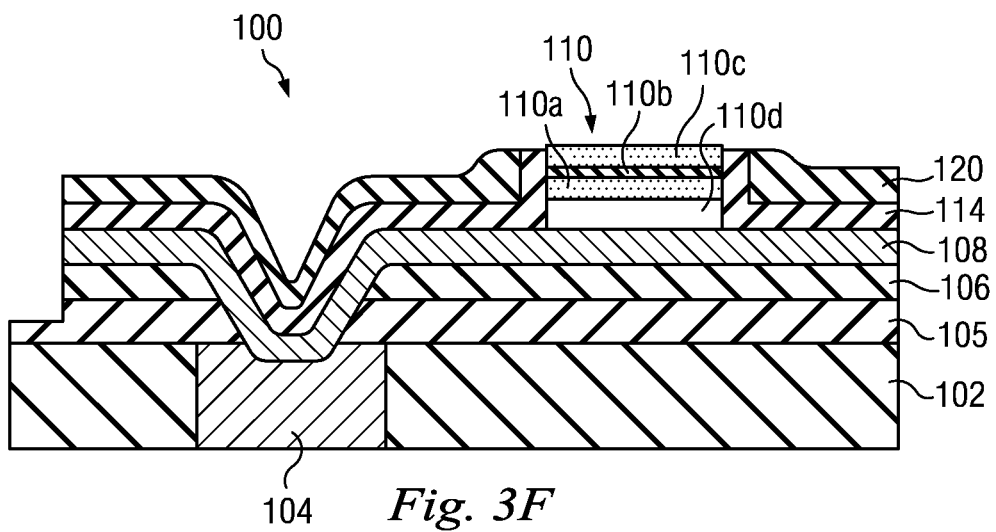

In step 210, a third dielectric layer 120 is formed over the dual-layer passivation layer 114, as illustrated in FIG. 3F. In one embodiment, the third dielectric layer 120 includes silicon oxide formed by plasma enhanced CVD. The third dielectric layer 120 is disposed on the dual-layer passivation layer 114 and substantially fills in the gaps between the MTJ stacks. In another embodiment, a polishing process, such as chemical mechanical polishing (CMP), may be applied to the dielectric layer 120 such that the portion of the dielectric layer 120 disposed on the MTJ stacks are removed and the dielectric layer 120 is planarized.

In step 212, a top electrode 122 is formed over the dielectric layer 120 and the MTJ stack, as illustrated in FIG. 1. Especially, the top electrode 122 is electrically connected to the free layer of the MTJ stacks. In another example when a metal layer 112 is deposited on the free layer and is patterned to cap the MTJ stacks, the top electrode 122 directly contacts the metal layer 112.

In various embodiments of the disclosed structure of a MRAM device and the method making the same, a dual-passivation layer is implemented to protect the MTJ stack from moisture and oxygen. The dual-passivation layer includes an oxygen-free dielectric layer adjacent the sidewalls of the MTJ stack. The oxygen diffusion is eliminated. Especially, the plasma damage to the MTJ is avoid when the oxygen-free layer is formed by a plasma-free deposition, such as radical CVD. The dual-passivation layer includes a moisture-blocking layer formed on and around the oxygen-free layer. The moisture-blocking layer provides effective protection to the MTJ stack from moisture.

Thus, the present disclosure provides one embodiment of a magnetoresistive random access memory (MRAM) device. The MRAM device includes a magnetic tunnel junction (MTJ) stack on a substrate; and a dual-layer passivation layer disposed around the MTJ stack. The dual-layer passivation layer includes an oxygen-free film formed adjacent sidewalls of the MTJ stack; and a moisture-blocking film formed around the oxygen-free film.

In one example, the oxygen-free film includes an oxygen-free dielectric material; and the moisture-blocking layer includes a metal oxide. In another example, the oxygen-free film includes one of silicon nitride and silicon carbide; and the moisture-blocking layer includes one of aluminum oxide (AlO), tantalum oxide (TaO) and titanium oxide (TiO). In yet another example, the oxygen-free film includes SiN formed by radical chemical vapor deposition (CVD); and the moisture-blocking layer includes AlO formed by physical vapor deposition (PVD).

In another example, the MRAM device further includes a silicon oxide layer over the dual-passivation layer and formed by plasma-enhanced CVD. In another example, the MTJ stack includes a pinning layer having an anti-ferromagnetic material; a pinned layer disposed over the pinning layer and having a first ferromagnetic material; a barrier layer disposed on the pinned layer and having a non-magnetic material; and a free layer disposed over the barrier layer and having a second ferromagnetic material.

In another example, the MTJ stack is formed over a bottom electrode; the device further comprising a top electrode formed over the MTJ stack; and each of the bottom and top electrodes includes tantalum (Ta). In yet another example, the MRAM device further includes a silicon carbide layer disposed on the substrate; and a silicon nitride layer disposed on the silicon carbide layer and being underlying the bottom electrode.

In another example, the pinned layer includes a first ferromagnetic layer; a second ferromagnetic layer disposed on the first ferromagnetic layer; and a spacer layer interposed between the first and second ferromagnetic layers.

The present disclosure provides another embodiment of a magnetoresistive random access memory (MRAM) device. The MRAM device includes a magnetic tunnel junction (MTJ) stack disposed on a bottom electrode; and a dual-layer passivation layer disposed around the MTJ stack. The dual-layer passivation layer includes an oxygen-free dielectric film formed around the MTJ stack; and a moisture-barrier layer formed around the oxygen-free film, wherein the moisture-barrier layer includes a metal oxide.

In one example, the MRAM device further includes a silicon carbide layer on a substrate; and a silicon nitride layer on the silicon carbide layer, wherein the bottom electrode is disposed on the silicon nitride layer.

In another example, the oxygen-free dielectric film includes silicon nitride; and the moisture-barrier layer includes one of aluminum oxide (AlO), tantalum oxide (TaO) and titanium oxide (TiO).

The present disclosure also provides an embodiment of a method of fabricating a magnetoresistive random access memory ("MRAM") cell. The method includes forming a magnetic tunnel junction ("MTJ") stack on a bottom electrode; depositing an oxygen-free film around the MTJ stack; and forming a moisture-barrier layer around the oxygen-free film. The oxygen-free film and the moisture-barrier layer are configured as a dual-passivation layer to protect the MTJ stack from moisture.

In one example of the disclosed method, the forming an oxygen-free layer includes depositing one of silicon nitride and silicon carbide by a plasma-free deposition.

In another example, the forming an oxygen-free layer includes depositing one of silicon nitride and silicon carbide by radical chemical vapor deposition (radical CVD).

In yet another example, the forming a moisture-barrier layer includes forming a metal oxide layer with a material selected form the group consisting of aluminum oxide (AlO), tantalum oxide (TaO) and titanium oxide (TiO).

In yet another example, the forming a metal oxide layer includes depositing the metal oxide layer by a one of physical vapor deposition (PVD) and atomic layer deposition (ALD).

In yet another example, the method further includes forming a silicon oxide layer over the dual-passivation layer by a plasma-enhanced chemical vapor deposition.

In yet another example, the method further includes forming a top electrode on the silicon oxide layer and on the MTJ stack.

In yet another example, the method further includes forming a silicon carbide layer on a substrate; forming a silicon nitride layer on the silicon carbide layer; and forming the bottom electrode on the silicon nitride layer.

In yet another example, the forming a MTJ stack includes forming a pinning layer; forming a pinned layer over the pinning layer; forming a barrier layer over the pinned layer; and forming a free layer over the barrier layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A magnetoresistive random access memory (MRAM) device comprising:
a magnetic tunnel junction (MTJ) stack on a substrate;
a dual-layer passivation layer disposed around the MTJ stack; and
a dielectric layer formed over the dual-passivation layer, the dielectric layer comprising a first material;
wherein the dual-layer passivation layer includes:
a first film formed adjacent sidewalls of the MTJ stack, wherein the first film comprises a second material different from the first material and has an oxygen concentration of less than ten atomic percent, and
a moisture-blocking film formed around the first film, wherein the moisture-blocking film comprises a third material different from the first and second materials and includes a metal oxide.

2. The device of claim 1 wherein:
the second material includes an oxygen-free dielectric material.

3. The device of claim 1, wherein:
the second material includes one of silicon nitride and silicon carbide; and
the third material includes one of aluminum oxide (AlO), tantalum oxide (TaO), and titanium oxide (TiO).

4. The device of claim 1 wherein:
the second material includes SiN formed by radical chemical vapor deposition (CVD); and
the third material includes AlO formed by physical vapor deposition (PVD).

5. The device of claim 1, wherein the first material comprises silicon oxide.

6. The device of claim 1, wherein the MTJ stack includes:
a pinning layer having an anti-ferromagnetic material;
a pinned layer disposed over the pinning layer and having a first ferromagnetic material;
a barrier layer disposed on the pinned layer and having a non-magnetic material; and
a free layer disposed over the barrier layer and having a second ferromagnetic material.

7. The device of claim 6, wherein the pinned layer includes:
a first ferromagnetic layer;
a second ferromagnetic layer disposed on the first ferromagnetic layer; and
a spacer layer interposed between the first and second ferromagnetic layers.

8. The device of claim 1 wherein:
the MTJ stack is formed over a bottom electrode;
the device further comprising a top electrode formed over the MTJ stack; and
each of the bottom and top electrodes includes tantalum (Ta).

9. The device of claim 8, further comprising:
a silicon carbide layer disposed on the substrate; and
a silicon nitride layer disposed on the silicon carbide layer and underlying the bottom electrode.

10. The device of claim 8 wherein the dual-layer passivation layer separates the dielectric layer from the bottom electrode.

11. The device of claim 1 wherein the second material has an oxygen concentration of less than one atomic percent.

12. The device of claim 1 wherein the first film has a first thickness and the moisture block layer has a second thickness less than the first thickness.

13. A magnetoresistive random access memory (MRAM) device comprising:
a magnetic tunnel junction (MTJ) stack disposed on a bottom electrode;
a dual-layer passivation layer disposed around the MTJ stack; and
a dielectric layer disposed around the dual-passivation layer, the dielectric layer comprising a first material;
wherein the dual-layer passivation layer includes:
a dielectric film formed around the MTJ stack, wherein the dielectric film comprises a second material different from the first material and has an oxygen concentration of less than ten atomic percent; and
a moisture-barrier layer formed around the dielectric film, wherein the moisture-barrier layer includes a third material different from the first and second materials, the third material including a metal oxide.

14. The device of claim 13, further comprising:
a silicon carbide layer on a substrate; and
a silicon nitride layer on the silicon carbide layer,
wherein the bottom electrode is disposed on the silicon nitride layer.

15. The device of claim 13, wherein
the second material includes silicon nitride; and
the third material includes one of aluminum oxide (AlO), tantalum oxide (TaO), and titanium oxide (TiO).

16. The device of claim 13 wherein the dielectric film has a first thickness and the moisture block layer has a second thickness less than the first thickness.

17. The device of claim 13 wherein:
the MTJ stack is formed over a bottom electrode; and
the dual-layer passivation layer separates the dielectric layer from the bottom electrode.

\* \* \* \* \*